United States Patent [19]
Mueller et al.

[11] 3,958,178
[45] May 18, 1976

[54] AUTOMATIC RANGING CIRCUIT FOR A DIGITAL PANEL METER

[75] Inventors: Theodore R. Mueller; Harley H. Ross, both of Oak Ridge, Tenn.

[73] Assignee: The United States of America as represented by the United States Energy Research and Development Administration, Washington, D.C.

[22] Filed: Feb. 11, 1975

[21] Appl. No.: 548,938

[52] U.S. Cl............................. 324/115; 324/99 D
[51] Int. Cl.² .................. G01R 15/08; G01R 17/06
[58] Field of Search................. 324/115, 99 D, 111, 324/131

[56] References Cited
UNITED STATES PATENTS

| | | |
|---|---|---|
| 3,187,323 | 6/1965 | Flood et al........................ 324/115 |
| 3,790,886 | 2/1974 | Kurtin et al....................... 324/99 D |

*Primary Examiner*—Robert J. Corcoran
*Assistant Examiner*—Ernest F. Karlsen
*Attorney, Agent, or Firm*—Dean E. Carlson; David S. Zachry; Louis M. Deckelmann

[57] ABSTRACT

This invention relates to a range changing circuit that operates in conjunction with a digital panel meter of fixed sensitivity. The circuit decodes the output of the panel meter and uses that information to change the gain of an input amplifier to the panel meter in order to insure that the maximum number of significant figures is always displayed in the meter. The circuit monitors five conditions in the meter and responds to any of four combinations of these conditions by means of logic elements to carry out the function of the circuit.

4 Claims, 1 Drawing Figure

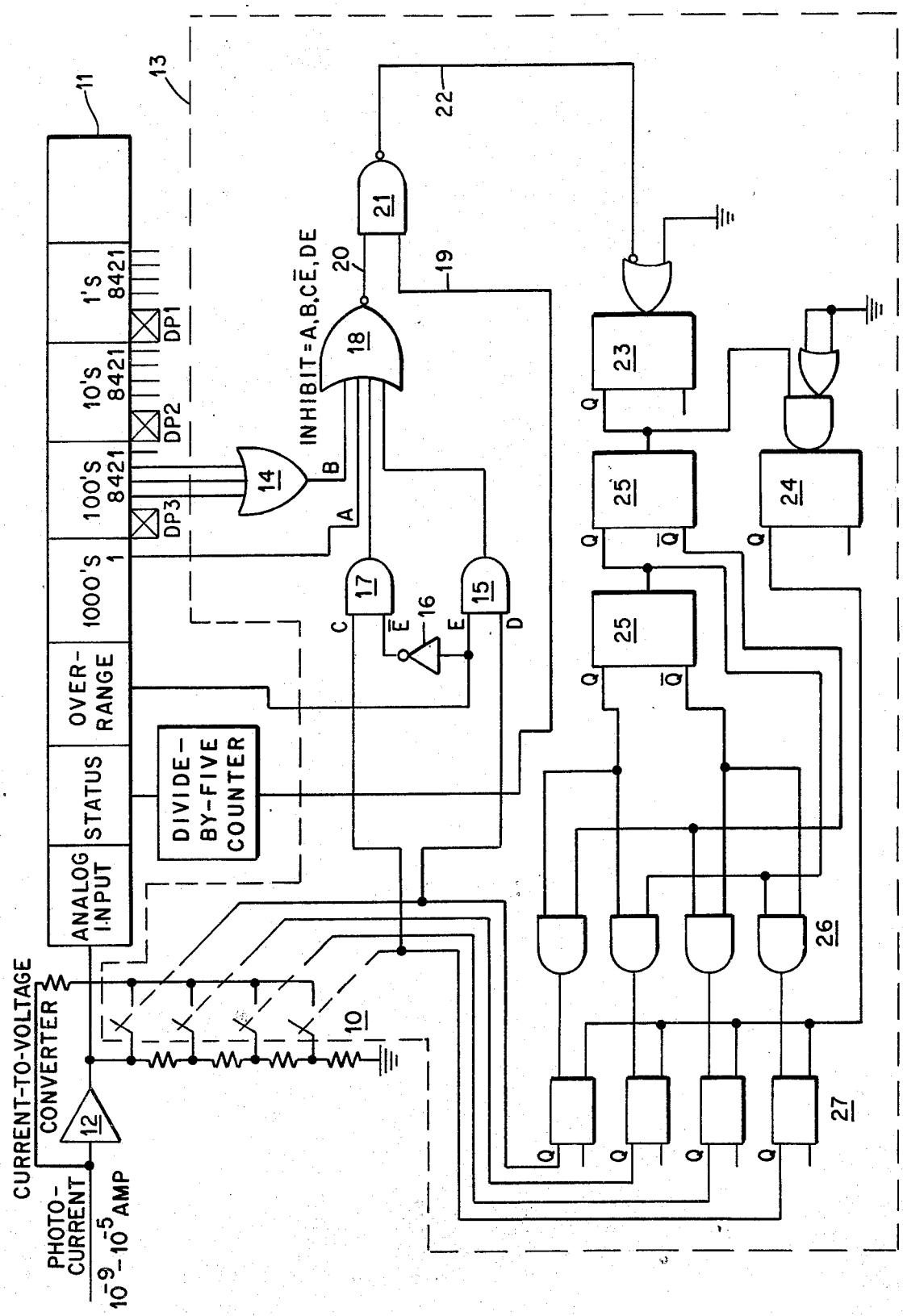

AUTOMATIC RANGING CIRCUIT FOR A DIGITAL PANEL METER

BACKGROUND OF THE INVENTION

This invention was made in the course of, or under, a contract with the United States Atomic Energy Commission.

Fluorometry is a widely used method for the determination of uranium in samples containing on the order of $10^{-6}$ to $10^{-9}$ grams of uranium. Recent emphasis on controlling the release of contaminants to the environment has increased the need for such analyses. The quantity of uranium present in any given sample is detected by a uranium fluorescence method wherein visible radiation generated in the sample is detected with a photomultiplier and the photocurrent is measured and displayed by utilizing a fluorophotometer and a readout device coupled thereto.

In the present invention it was desired to use a digital panel meter as the readout device instead of an analog panel meter as was used previously. A typical signal of the fluorophotometer covers four orders of magnitude in the range of $10^{-9}$ to $10^{-5}$ amperes. In order to apply a digital panel meter (DPM) to the photocurrent signal, it is necessary to amplify the signal and convert it from a current to a voltage input. Both the amplification and signal conversion can be carried out in a single device. A high input impedance operational amplifier that is simultaneously a current-to-voltage converter is used at the input to the DPM for this purpose.

The digital panel meter being one of the newer low-cost devices, lacks a range changing feature and has only a fixed sensitivity. Since the input signal to the DPM covers many orders of magnitude, there is a desired need for providing an automatic range changing system for the DPM and simultaneously for the amplifier. The present invention was conceived to meet this need in a manner to be described hereinbelow.

SUMMARY OF THE INVENTION

It is the object of the present invention to provide an automatic range changing circuit for a digital panel meter of fixed sensitivity.

The above object has been accomplished in the present invention by providing a circuit for decoding the output of a digital panel meter (DPM) and using that information to change the gain of an input amplifier to the meter so that it always operates in the best signal-to-noise region, and to change the decimal point in the DPM.

BRIEF DESCRIPTION OF THE DRAWING

The single FIGURE in the drawing is a schematic block diagram of the automatic range changing circuit of the present invention for a digital panel meter of fixed sensitivity.

DESCRIPTION OF THE PREFERRED EMBODIMENT

Before giving the circuit details, it will be useful to describe the operational principle of the range changing circuit and to give the expression that is used to define the circuit. As stated hereinabove, the present invention will involve decoding from the digital panel meter itself. The circuit examines five conditions or prerequisites, each derived from the meter, and responds to inhibit range changing under four specific combinations of these conditions. These five conditions require answers to each of the following questions, each one being signated by one of the questions A through E:

A = Is the value of the most significant digit (MSD), the maximum that can occur?
B = Is the value of the 2nd MSD greater than 1?
C = Is the decimal point in the MSD position?
D = Is the decimal point in the least significant digit (LSD) position?
E = Is the over-range signal present?

Each of these conditions has only a yes or no answer (one of two possible states) making a total of $2^5$ or 32 combinations in all. Many of the combinations are irrelevant or degenerate and, in fact, only four of the combinations are employed by the decoding circuit of the present invention. The four combinations that will cause the circuit to inhibit range changing are given as follows:

A, or B, or (C and not E), or D and E.

Turning now to the single drawing FIGURE, reference numeral 13 represents the decoding circuit of the present invention connected to a digital panel meter 11 and its variable gain device 12 which in this case is an input amplifier which functions as a current-to-voltage converter. The panel meter 11 is an analog-to-digital converter of the 3½ digit type (3 full decades and an over-range signal). Its input is from 0–200 mv and the range is from 0–1,999. A binary-coded-decimal-representation on one of four lines of each of the three digits (1's, 10's, and 100's) shown on the meter face is available. Typically, a digital panel meter also has a STATUS (end-of-conversion) signal available for indicating the completion of the internal conversion process of the meter.

The numerals 14 through 18 in the FIGURE indicate standard TTL logic devices that are used to decode the panel meter 11. Normally, at least one input to the NOR gate 18 is always high, except when the meter 11 reaches a condition for a range change. All inputs are then low. The NOR gate 18 is thus understood to inhibit range changing when any input A, B, $\overline{CE}$, or $\overline{DE}$ is true. The conditions A through E are provided as follows. Condition A is simply the presence of an output in the 1000's digit of the meter 11; B is from a NOR gate 14 that has the 2, 4 and 8 binary signals from the 2nd MSD as its input; C and D are taken directly from the latch 27 output to indicate the presence of the decimal point in either the MSD or LSD position, respectively; E is the over-range indication. It can be seen that both signals E and D have to be present for the AND gate 15 to produce an output signal. Likewise, both C and $\overline{E}$ (obtained by the inverter 16) must be present for the gate 17 to give its output signal.

The NOR gate 18 output on lead 20, which is normally low, goes high during the call for a range change. This input (lead 20) to the NAND 21 gates is so that the output of the NAND 21 will be opposite of the signal on the other input, lead 19. Lead 19 carries the STATUS signal from the meter 11 and is an oscillating signal, i.e., clock pulses. These clock pulses, after inversion, trigger the one-shot 23 via lead 22. The one-shot 23 jointly triggers a second one-shot 24 having a long RC time constant and advances a divide-by-four counter 25.

The counter 25 has four states providing four mutually exclusive conditions that are used to drive a decoder 26 which is a series of AND gates. The output of the unit 26 then goes to four relay-driven solid state switches 10 via a latch 27. By thus advancing to a new input signal level, the meter 11 will cause the NOR 18 to either remain high or return to its normally low state. The clock pulses on lead 22 continue to step the switches 10 until the switch 10 is closed that correctly adjusts the gain of the amplifier converter 12. The absence of further clock pulses on lead 22 permits the one-shot 24 to time out, disabling the circuit 13 and latching the meter 11 reading.

The above-described system is useful in a trace uranium procedure, wherein the fluorophotometer readout system is direct reading from 1 ng to 2 $\mu$g of U, and achieves a concentration-independent precision of ± 2% in the range indicated. The above-described readout system can also be utilized in transuranium burnup or beryllium hydride measurement instrumentation among other possible uses therefor.

This invention has been described by way of illustration rather than by limitation and it should be apparent that it is equally applicable in fields other than those described. For example, the above-described circuit is applicable to any kind of analog input where the sensitivity of the transducer is required to be adjusted automatically to cover the measurement range desired, and is thus not limited to the 3½ digit meter described above.

What is claimed is:

1. In a measuring system for measuring a variable signal input including a digital panel meter having a fixed sensitivity and including an end-of-conversion (STATUS) output signal, and a variable gain device connected between said signal input and said meter, the improvement comprising circuit means for automatically adjusting the gain of said gain device to provide the maximum number of significant figures for display on said meter, said means comprising a NOR gate, a plurality of logic devices connected between a plurality of outputs from said meter and said NOR gate, a NAND gate connected at its input jointly to the output of said NOR gate and to said STATUS output signal, said STATUS signal providing clock pulses to said NAND gate, a plurality of switches connected to said gain device for adjusting the gain thereof, a latch device for actuating respective ones of said switches, and switching means connected between the output of said NAND gate and said latch device for switching selected ones of said switches in response to a call for a range change as sensed by said logic devices.

2. The system set forth in claim 1, wherein said variable gain device comprises an operational amplifier provided with a voltage divider coupled to said plurality of switches, and said switches being solid state switches.

3. The system set forth in claim 2, wherein said plurality of logic devices include a second NOR gate connected between said first mentioned NOR gate and the 2, 4 and 8 binary signals from the second most significant digit of said meter; a first AND gate having its output connected to said first NOR gate and having one input from an over-range signal from said meter and a second input from one output of said latch device; a second AND gate having its output connected to said first NOR gate and having an inverted first input from said over-range signal and a second input from another output of said latch device; and the output from the most significant digit of said meter being connected directly to said first NOR gate.

4. The system set forth in claim 3, wherein said switching means includes a first one-shot unit connected to the output of said NAND gate; a second one-shot unit with a long RC time constant connected between said first one-shot unit and said latch device; a divide-by-four counter connected to the output of said first one-shot unit; and a series of AND gates coupled between the output of said counter and said latch device.

* * * * *